(12) United States Patent
Tanaka

(10) Patent No.: US 7,488,999 B2
(45) Date of Patent: Feb. 10, 2009

(54) SOLID-STATE IMAGING DEVICE

(75) Inventor: Makoto Tanaka, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 267 days.

(21) Appl. No.: 11/600,058

(22) Filed: Nov. 16, 2006

(65) Prior Publication Data

US 2007/0131974 A1 Jun. 14, 2007

(30) Foreign Application Priority Data

Dec. 13, 2005 (JP) ............................. 2005-358911

(51) Int. Cl.
*H01L 29/26* (2006.01)
(52) U.S. Cl. ........................................ 257/239; 257/72
(58) Field of Classification Search ................... 257/72, 257/239
See application file for complete search history.

(56) References Cited

U.S. PATENT DOCUMENTS 5,438,211 A * 8/1995 Nakamura et al. .......... 257/239
6,563,149 B2 * 5/2003 Iizuka et al. ................ 257/222

FOREIGN PATENT DOCUMENTS

| JP | 1-196175 | 8/1989 |
|---|---|---|
| JP | 5-325589 | 12/1993 |

* cited by examiner

*Primary Examiner*—Douglas M Menz
(74) *Attorney, Agent, or Firm*—Young & Thompson

(57) ABSTRACT

A solid-state imaging device includes a transfer element line for transferring an electric charge that is photoelectrically converted in a photoelectric conversion element line formed of a plurality of photoelectric conversion elements, and a charge detector for detecting an electric charge that is transferred by the transfer element line. The charge detector includes output gates disposed adjacently to a final transfer gate of the transfer element line, a reset gate for resetting an electric charge in the charge detector, a floating diffusion formed on a substrate surface adjacently to the output gates and the reset gate, and addition gates formed above the floating diffusion and along the direction from the output gates to the reset gate.

20 Claims, 15 Drawing Sheets

SOLID-STATE IMAGING DEVICE

BACKGROUND OF THE INVENTION

1. Field of the Invention

The present invention relates to a solid-state imaging device of converting light into an electric charge for detection and, particularly, to a solid-state imaging device with improved charge detection efficiency.

2. Description of Related Art

FIG. 1 shows the configuration of a typical CCD image sensor. As shown in FIG. 1, a typical CCD image sensor 10 includes a photodiode line 11, a register 13, a transfer gate 12, and a charge detector 14. The photodiode line 11 is formed of a line of photodiodes that convert incident light into a signal electron by photoelectric conversion to accumulate electric charges. The register 13 transfers a signal charge. The transfer gate 12 transfers a signal charge from the photodiode to the register 13. The charge detector 14 converts a charge signal into a voltage signal.

In the CCD image sensor 10 having such a configuration, the electric charge which is photoelectrically converted and accumulated in each photodiode is transferred through the transfer gate 12 to the register 13. In the register 13, the electric charge is sequentially transferred by two-phase driving to the charge detector 14.

FIG. 19 shows a charge detector that is typically used in the above CCD image sensor, which is referred to hereinafter as the related art 1. The charge detector 104 includes two output gates 201 and 202 which are connected to a final-stage transfer gate (register gate) 209 and supplied with a constant voltage, a reset gate 203, and a reset drain 204 which is supplied with a constant voltage. The charge detector 104 converts an electric charge into a voltage and then transfers the voltage signal through a contact 105 to an amplifier 16 shown in FIG. 1. The amplifier 16 amplifies the voltage signal as needed and outputs the amplified signal.

The electric charge in the charge detector 104 is abandoned to the reset drain 204 to which a constant voltage is applied when the reset gate 203 is set to High, thereby entering the reference output mode in which the output signal is 0.

The CCD image sensor can convert from a smaller amount of electric charges into a larger amount of voltages as the detection efficiency is higher. The detection efficiency is a coefficient for converting an electric charge into a voltage. The high detection efficiency enables high-speed operation by suppressing the gain of the amplifier in the subsequent stage. Further, an increase in the signal gives a higher signal-to-noise (S/N) ratio.

The detection efficiency is represented by the floating capacitance (=C) of the portion for accumulating electric charges in the charge detector and an elementary charge (=e) as follows:

Detection efficiency=$e/C$($V$/electron).

Thus, the detection efficiency can be enhanced if the floating capacitance C is reduced. Because the floating capacitance C is a sum of the base capacitance and the side capacitance of the portion where electric charges are accumulated (i.e. floating diffusion: FD), the capacitance can be reduced by decreasing the area of the floating diffusion and the area of the side surfaces surrounding the portion.

FIG. 20 shows another example of a charge detector as disclosed in Japanese Unexamined Patent Application Publication No. 1-196175, for example, which is referred to herein as the related art 2. FIG. 20 corresponds to the section along XX-XX' in FIG. 19. The charge detector includes a final-stage register gate 219, an output gate 212, a contact 215, a reset gate 213a, a reset gate 213b as a reset noise reduction gate to which a constant voltage is applied, a drain 214, and a floating diffusion 216. The reset noise reduction gate 213b which is supplied with a constant current is disposed in the previous stage of the reset gate 213a, thereby enabling the reduction of reset noise.

Further, a technique of establishing connection with a wide register or a narrow charge detector without deteriorating the charge transfer efficiency is disclosed in Japanese Unexamined Patent Application Publication No. 5-325589, which is referred to herein as the related art 3. According to this technique, the use of a narrow charge detector enables the reduction of floating capacitance to thereby enhance the detection efficiency.

Because the area of the floating diffusion 216 and the area of the side surfaces surrounding this portion in the related art 2 is the same as that in the related art 1, the floating capacitance C stays the same. The detection sensitivity thus cannot be improved.

According to the related art 3, if the width of the register is inherently narrow, it is unable to reduce the floating capacitance to enhance the detection efficiency. Further, because the area of the floating diffusion cannot be reduced drastically, the effect of enhancing the detection efficiency is small.

SUMMARY OF THE INVENTION

According to an aspect of the present invention, there is provided a solid-state imaging device including a transfer element line transferring an electric charge photoelectrically converted in a photoelectric conversion element line formed of a plurality of photoelectric conversion elements, and a charge detector detecting an electric charge transferred by the transfer element line. The charge detector includes an output gate connected to a final stage of the transfer element line, a floating diffusion converting an electric charge transferred through the output gate into a voltage, a reset gate resetting the floating diffusion, and an addition gate formed above the floating diffusion and along an end from the output gate to the reset gate and supplied with a constant voltage.

In this invention, because of the presence of the addition gate that is disposed above the floating diffusion and along the end from the output gate to the reset gate and supplied with a constant voltage, the potential gradient is given to the floating diffusion to thereby reduce the capacitance.

The present invention thereby provides a solid-state imaging device capable of reducing the floating capacitance to improve the detection sensitivity.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

Figure 1:
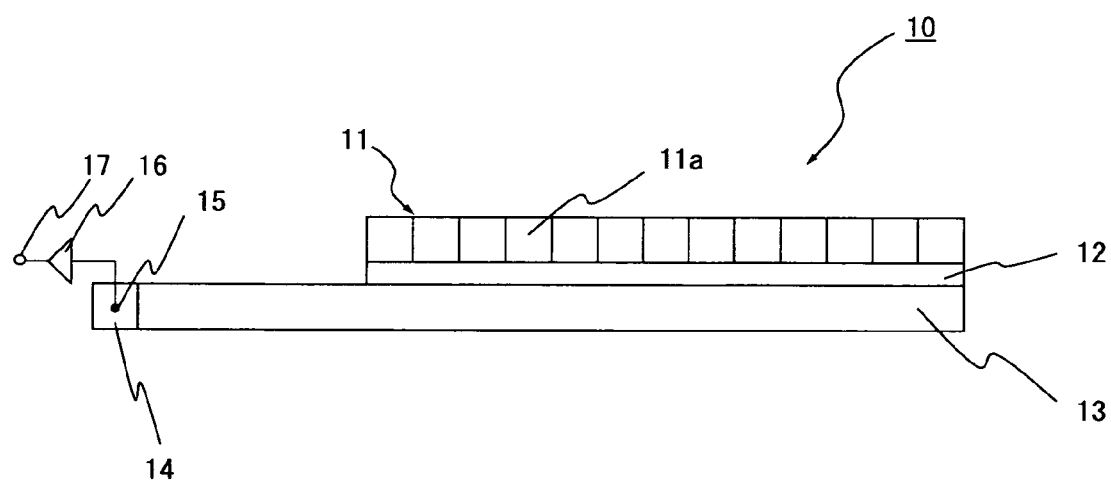
FIG. 1 is a pattern diagram showing a typical CCD image sensor.

Exemplary embodiments of the present invention are described hereinafter in detail with respect to the drawings. To begin with, the configuration of a typical CCD image sensor is described hereinafter. FIG. 1 shows the configuration of a typical CCD image sensor. As shown in FIG. 1, a CCD image sensor 10 includes a photodiode line 11, a register 13, a transfer gate 12, and a charge detector 14. The photodiode line 11 is formed of a line of photodiodes that convert incident light into a signal electron by photoelectric conversion to accumulate electric charges. The register 13 transfers a signal charge. The transfer gate 12 transfers a signal charge from the photodiode to the register 13. The charge detector 14 converts a charge signal into a voltage signal.

In the CCD image sensor 10 having such a configuration, the electric charge which is photoelectrically converted and accumulated in each photodiode is transferred through the transfer gate 12 to the register 13. In the register 13, the electric charge is sequentially transferred by two-phase driving to the charge detector 14.

Figure 2:
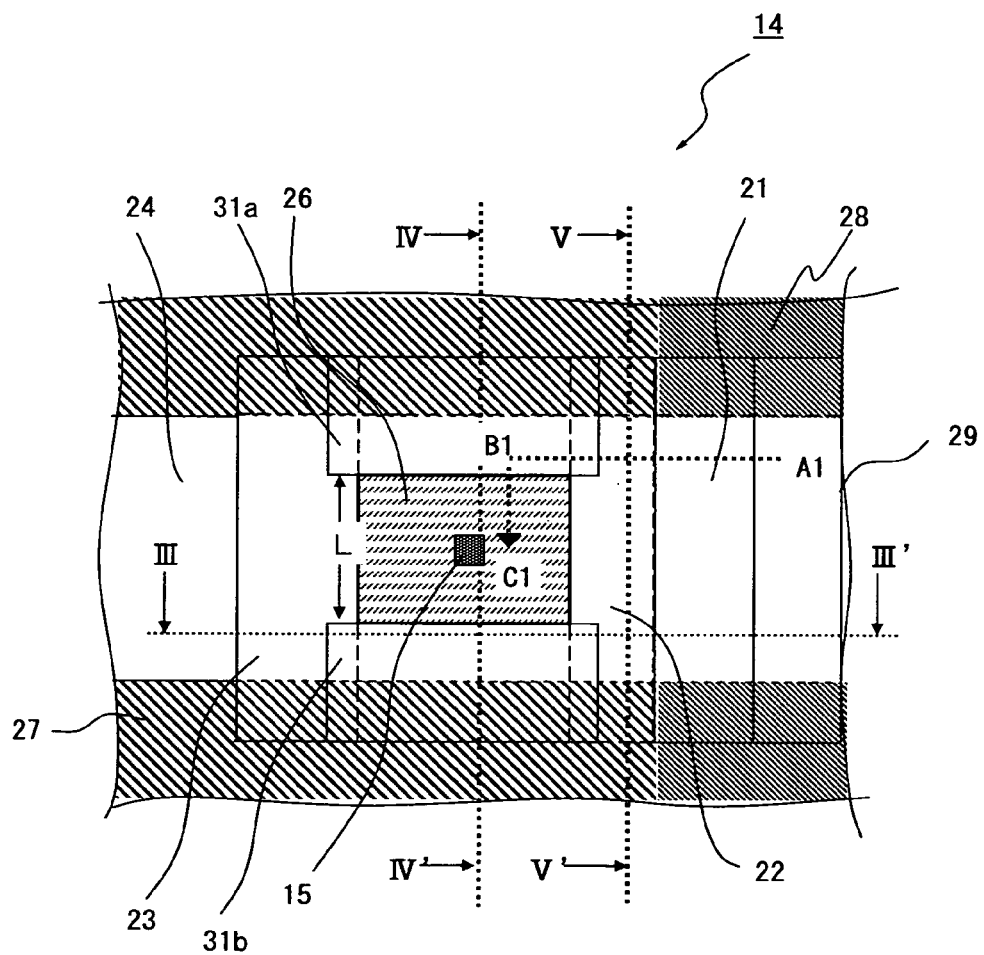
FIG. 2 is a view showing a charge detector of a CCD image sensor according to a first embodiment of the present invention.
Figure 19:
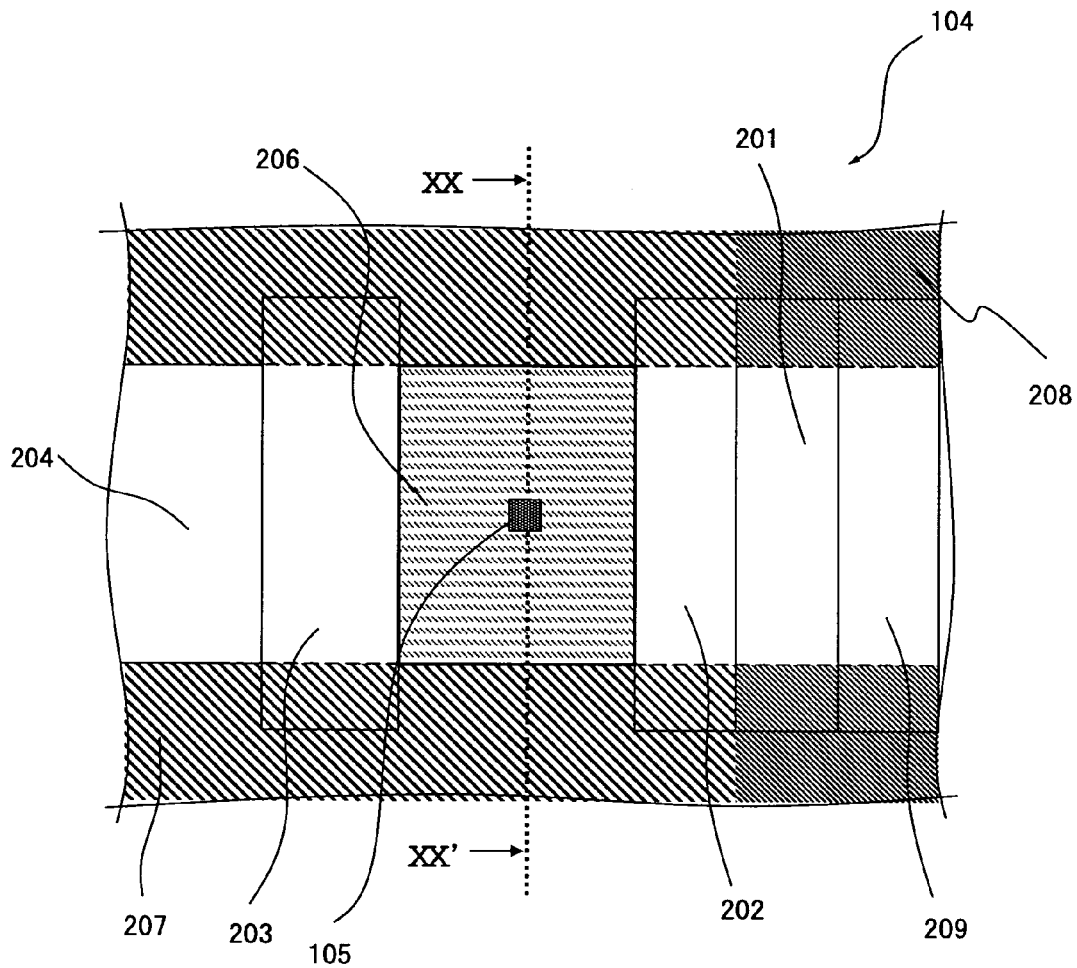
FIG. 19 is a view showing a charge detector according to the related art 1.
Figure 20:
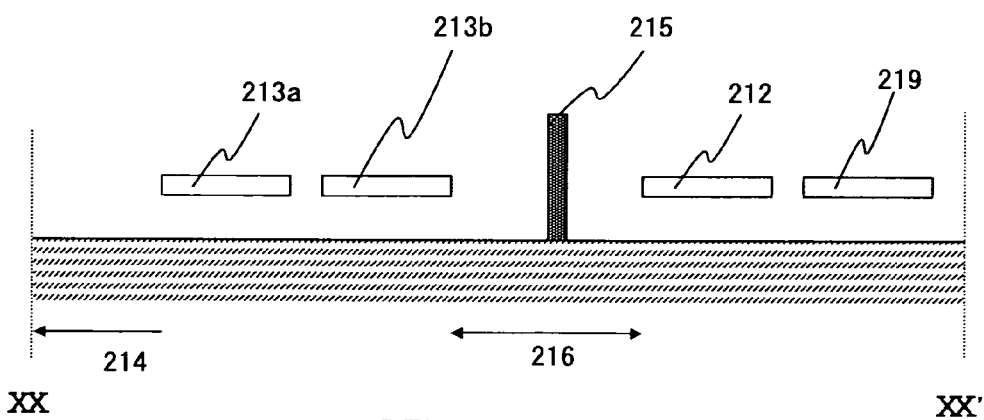
FIG. 20 is a view showing a charge detector according to the related art 2.

FIG. 2 shows a charge detector of the CCD image sensor according to a first embodiment of the present invention. The charge detector of this embodiment has lower floating capacitance than the charge detector of the related art 1 shown in FIG. 19 to thereby improve the detection sensitivity. To this end, the charge detector of this embodiment has two more gates in addition to the charge detector of the related art 1 shown in FIG. 19.

Specifically, the charge detector 14 of this embodiment includes two output gates 21 and 22 which are disposed adjacent to a final transfer gate 29 and supplied with a constant voltage, a reset gate 23, a reset drain 24 which is supplied with a constant voltage, and addition gates 31a and 31b. In the charge detector 14, a channel stopper 28 is formed below the final transfer gate 29 and the first output gate 21, and a locos oxide film 27 is formed to extend from the second output gate 22 to the reset drain 24. The charge detector 14 converts an electric charge into a voltage and then transfers the voltage signal through a contact 15 to an amplifier 16 shown in FIG. 1. The amplifier 16 amplifies the voltage signal as needed and outputs the amplified signal. The electric charge in the charge detector 14 is abandoned to the reset drain 24 to which a constant voltage is applied when the reset gate 23 is set to High, thereby entering the reference output mode in which the output signal is 0.

The addition gates 31a and 31b are formed to act as a bridge between the reset gate 23 and the first and second output gates 21 and 22 which are adjacent to the final-stage register gate. The addition gates 31a and 31b are formed in a different layer from the second output gate 22 and the reset gate 23. Therefore, compared with the related art in which the floating diffusion (floating capacitor) is a diffusion area surrounded by the second output gate 22, the reset gate 23 and the locos oxide film 27, the width of the diffusion area is narrowed by the addition gates 31a and 31b in this embodiment. Specifically, the floating diffusion of this embodiment is the area surrounded by the second output gate 22, the addition gate 31a, the reset gate 23, and the addition gate 31b as shown in FIG. 2, which is smaller than that in the related art.

Figure 3A:
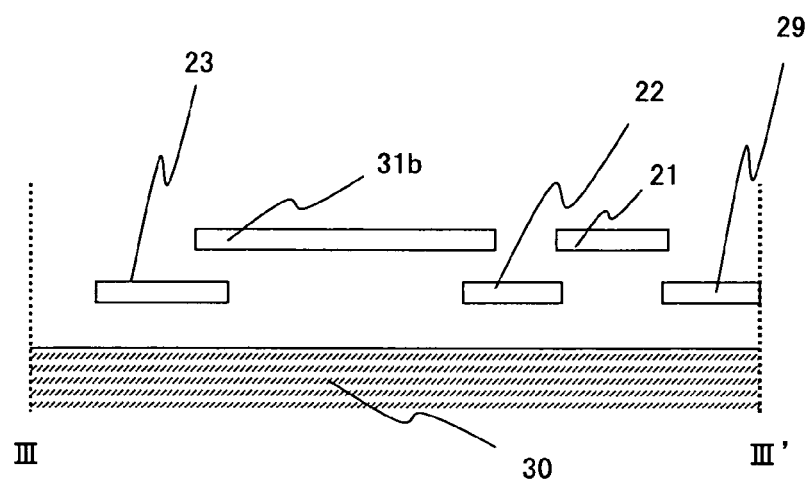
FIGS. 3A and 3B are sectional views along the line III-III' in FIG. 1.
Figure 3B:
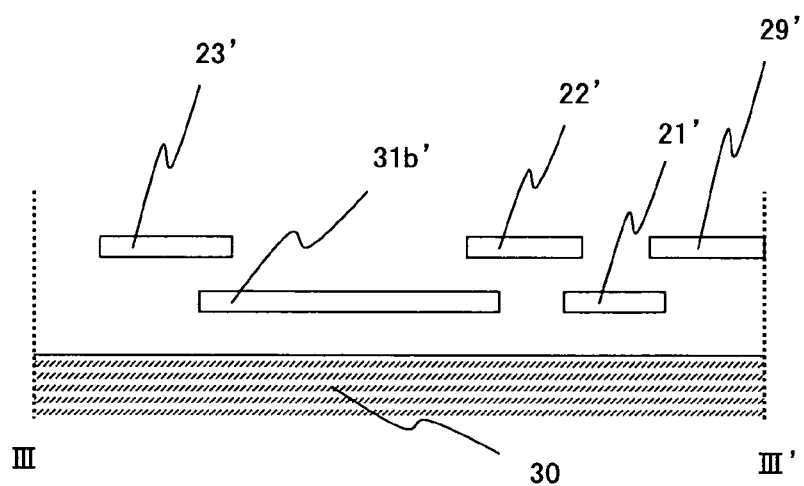

The positions of the addition gates 31a and 31b are as follows. FIG. 3A shows the cross section along the line III-III' in FIG. 2. FIG. 3B shows another example of the cross section. In FIG. 3B, the elements corresponding to the first output gate 21, the second output gate 22, the reset gate 23, the addition gate 31b, and the final transfer gate 29 are indicated as a first output gate 21', a second output gate 22', a reset gate 23', an addition gate 31b', and a final transfer gate 29', respectively.

In the charge detector 14 of this embodiment, the addition gate 31b may be disposed above the reset gate 23 and the second output gate 22 above a silicon substrate 30 as shown in FIG. 3A. The charge detector 14, however, does not necessarily have the configuration of FIG. 3A. For example, the addition gate 31b' may be disposed below the reset gate 23' and the second output gate 22' as shown in FIG. 3B. Thus, the configuration may be such that the addition gate 31b is disposed above the reset gate 23 and the second output gate 22 or the addition gate 31b' is disposed below the reset gate 23' and the second output gate 22'. They should be arranged so that the addition gates 31a, 31b (31a', 31b') is not short-circuited with the second output gate 22 (22') or the reset gate 23 and (23').

Figure 4:
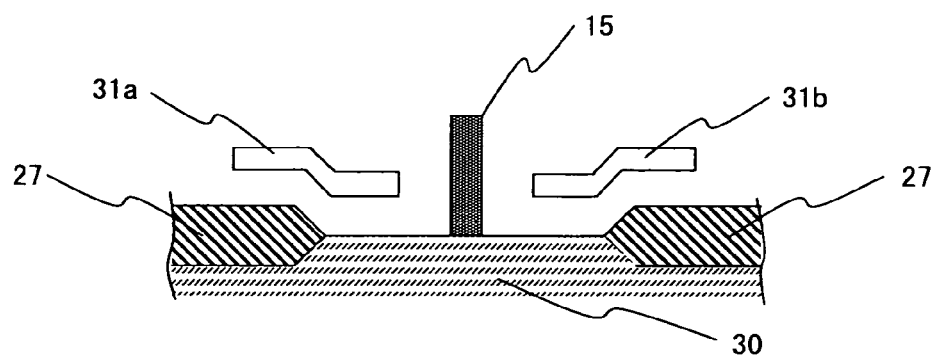
FIG. 4 is a sectional view along the line IV-IV' in FIG. 2.
Figure 5:
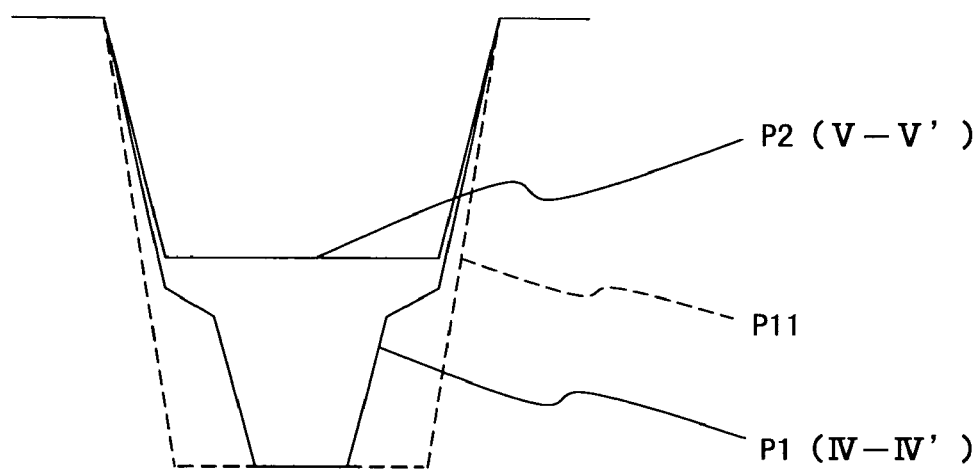
FIG. 5 is a view showing potentials P1 and P2 in the section IV-IV' and the section V-V' in FIG. 2.

The effects of this embodiment are described hereinafter. FIG. 4 shows the cross section along the line IV-IV' in FIG. 2. FIG. 5 shows the potentials P1 and P2 in the cross section along the line IV-IV' and the cross section along the line IV-IV', respectively.

As shown in FIG. 5, a constant voltage is applied to the addition gates 31a and 31b in order that the potentials below the addition gates 31a and 31b are in the range between the potential below the second output gate 22 (the middle part of the cross section V-V') and the potential of the floating diffusion 26 (the bottom part of the cross section IV-IV'), that is, equal to or higher than the potential below the second output gate 22 and equal to or lower than the potential of the floating diffusion 26. Due to the presence of the addition gates 31a and 31b, the potential P1 has a step-like shape in which the width of the part where the potential is deepest, i.e. the voltage is highest (the middle part of the cross section IV-IV') is narrowed. By way of comparison, FIG. 5 also shows the potential P11 (the cross section XX-XX') of the charge detector of the related art 1 which corresponds to the potential P1 of this embodiment.

The electrons flow to the part where the potential is deep (i.e. the voltage is high). As a result, the electrons are concentrated around the middle part where the potential well is deepest. By accumulating the electrons around the middle part and thereby reducing the volume of the accumulated electrons, the floating capacitance C can be reduced accordingly. Further, if the semiconductor substrate is P-type, a large amount of P+ is injected below the locos oxide film 27 for device isolation so that the concentration of P+ is high there. Therefore, the contact with an N-type diffusion layer as the floating diffusion 26 forms PN junction capacitance, which deteriorates the detection efficiency. By applying a voltage to the addition gates 31a and 31b so that the electrons are concentrated around the middle part of the floating diffusion 26, a distance between the parts where the electrons are accumulated can be separated from the locos oxide film 27, thereby eliminating the PN junction capacitance.

In this way, this embodiment arranges the addition gates 31a and 31b so as to act as a bridge between the ends of the reset gate 23 and the second output gate 22 and applies a constant voltage to the addition gates 31a and 31b. This embodiment thereby enables the reduction of the floating capacitance as a first effect. As described above, the detection efficiency is represented by the floating capacitance (=C) and the elementary charge (=e) as:

Detection efficiency=$e/C$($V$/electron).

The reduction of the floating capacitance leads to the improvement of the detection efficiency to thereby increase the detection sensitivity. This embodiment further has the following effects.

This embodiment also enables the reduction of reset noise as a second effect. The reset noise generally occurs in an output signal because the inductive portion of the reset pulse is superposed thereon. If the reset noise is low, the output can be amplified without range over before it is input to an analog-digital converter (ADC), thereby increasing the voltage resolution. Further, if the reset noise is low, the reset noise can be cancelled easily in a circuit of a subsequent stage.

As described above, the presence of the addition gates 31a and 31b reduces a distance L (see FIG. 2) where the reset gate 23 and the floating diffusion 26 contact with each other to thereby reduce the contact area thereof. In this configuration, the parasitic capacitance between the reset gate 23 and the floating diffusion 26 is reduced. Consequently, the floating diffusion 26 is less likely to be affected by the reset signal. Further, because the channel becomes wider toward the reset drain 24 in this configuration, the electrons which are accumulated below the reset gate 23 when the reset signal is OFF are more likely to flow toward the reset drain 24 than toward the floating diffusion 26. The reset noise can be thereby reduced.

This embodiment further enables, as a third effect, the suppression of a change in the floating capacitance in spite of misalignment. Because the reset gate 23 and the second output gate 22 are formed in the same layer, and the two addition gates 31a and 31b are formed in the same layer, the floating diffusion 26 can be horizontally interposed between the electrodes of the same layer (i.e. the reset gate 23 and the second output gate 22, or the addition gates 31a and 31b). In this configuration, even if the position of the electrode formed of polysilicon or the like is displaced due to misalignment, for example, the area and shape of the floating diffusion 26 do not substantially change. The change in the floating capacitance can be thereby suppressed.

Figure 6:
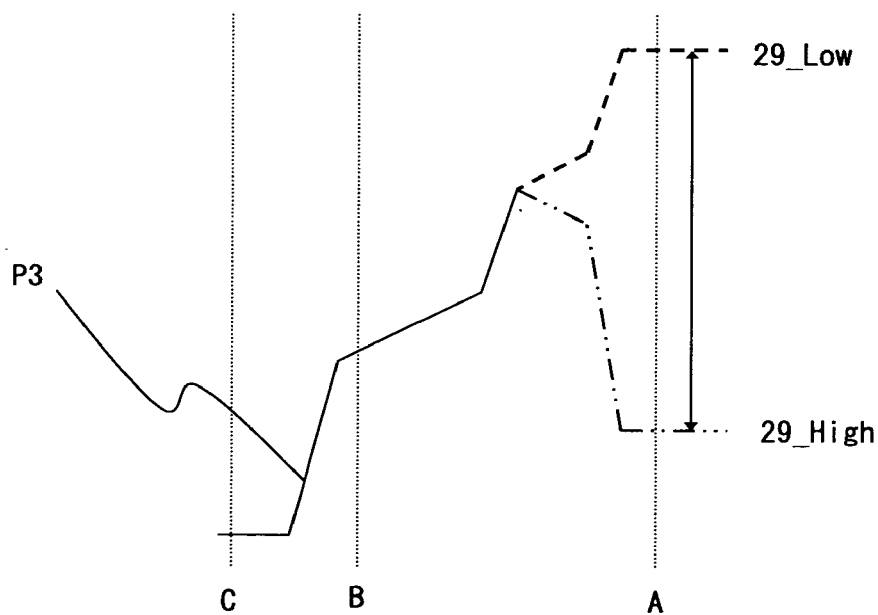
FIG. 6 is a view to describe the potential gradient along the points A1, B1 and C1 in FIG. 2.

This embodiment further enables, as a fourth effect, the smooth transfer of electric charges to the floating diffusion 26. FIG. 6 is a view to describe the potential gradient along the points A1, B1 and C1 in FIG. 2. In FIG. 6, 29_Low and 29_High indicate the voltages which are applied to the final-stage register gate. A constant voltage is applied to the addition gates 31a and 31b so that they act in the same manner as a third output gate. This provides a sufficient channel width and a smooth potential gradient, thereby preventing the reduction of a charge transfer speed.

Further, as a fifth effect, this embodiment allows electrons to drift away from the floating diffusion 26 toward the reset drain 24 easily, thereby shortening a minimum width of a reset pulse required. This reduces a required time for reset ON to thereby increase an electron drift speed upon reset ON.

Although two addition gates are added in the configuration described in this embodiment, either one addition gate may be added instead with equal effects.

Second Embodiment

Figure 7:
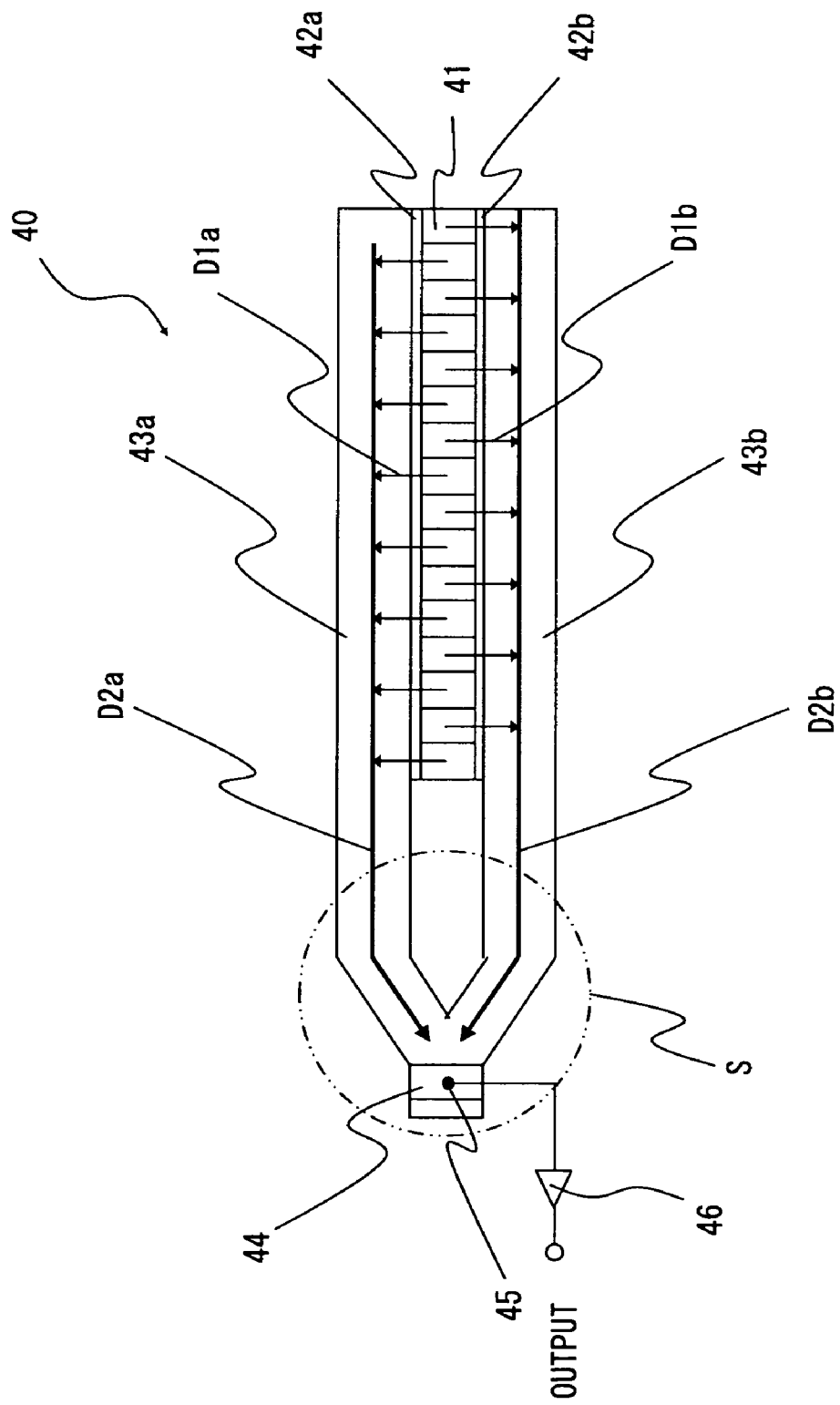
FIG. 7 is a view showing a CCD image sensor according to a second embodiment of the present invention.

FIG. 7 shows a CCD image sensor according to a second embodiment of the present invention. A CCD image sensor 40 of this embodiment includes a photodiode line 41, a first register 43a, a second register 43b, a first transfer gate 42a, a second transfer gate 42b, and a charge detector 44. The photodiode line 41 is formed of a line of photodiodes that convert incident light into a signal electron by photoelectric conversion to accumulate electric charges. The registers 43a and 43b transfer a signal charge. The transfer gates 42a and 42b transfer a signal charge from the photodiode to the registers 43a and 43b. The charge detector 44 converts a charge signal into a voltage signal.

In the CCD image sensor 40 having such a configuration, the electric charge which is photoelectrically converted and accumulated in each photodiode is transferred alternately through the transfer gates 42a and 42b to the registers 43a and 43b, respectively. In the registers 43a and 43b, the electric charge is sequentially transferred to the charge detector 44. The charge detector 44 converts an electric charge into a voltage and then transfers the voltage signal through a contact 45 to an amplifier 46. The amplifier 46 amplifies the voltage signal as needed and outputs the amplified signal.

In the CCD image sensor having such a configuration where the charge detector 44 is shared by two registers 43a and 43b, the effects described in the first embodiment, such as the reduction of the floating capacitance to improve the detection sensitivity and the reduction of reset noise, become more significant. The effect of the present embodiment is described herein below.

Figure 8:
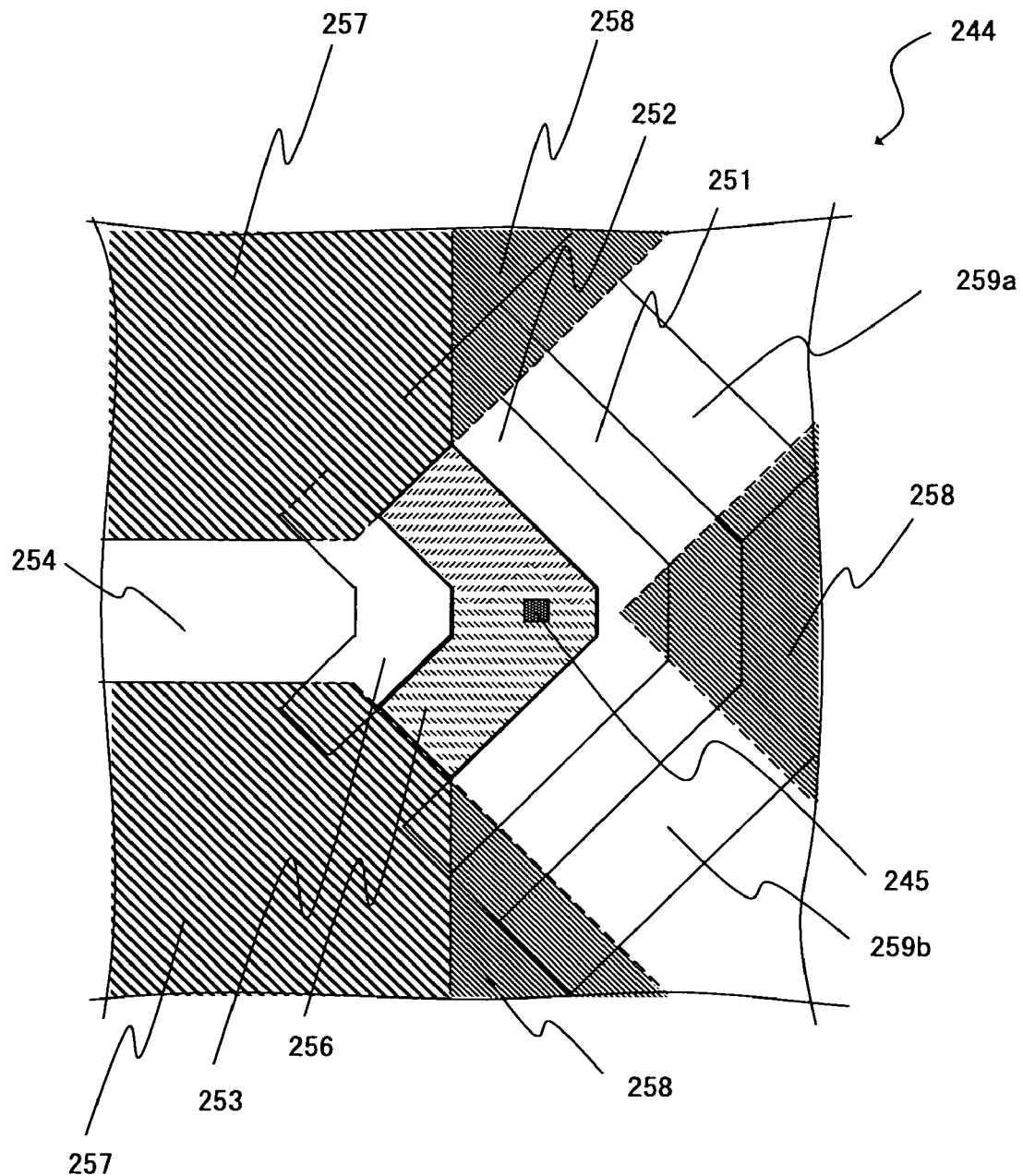
FIG. 8 is a view showing a charge detector of charge composition type according to a related art.
Figure 9:
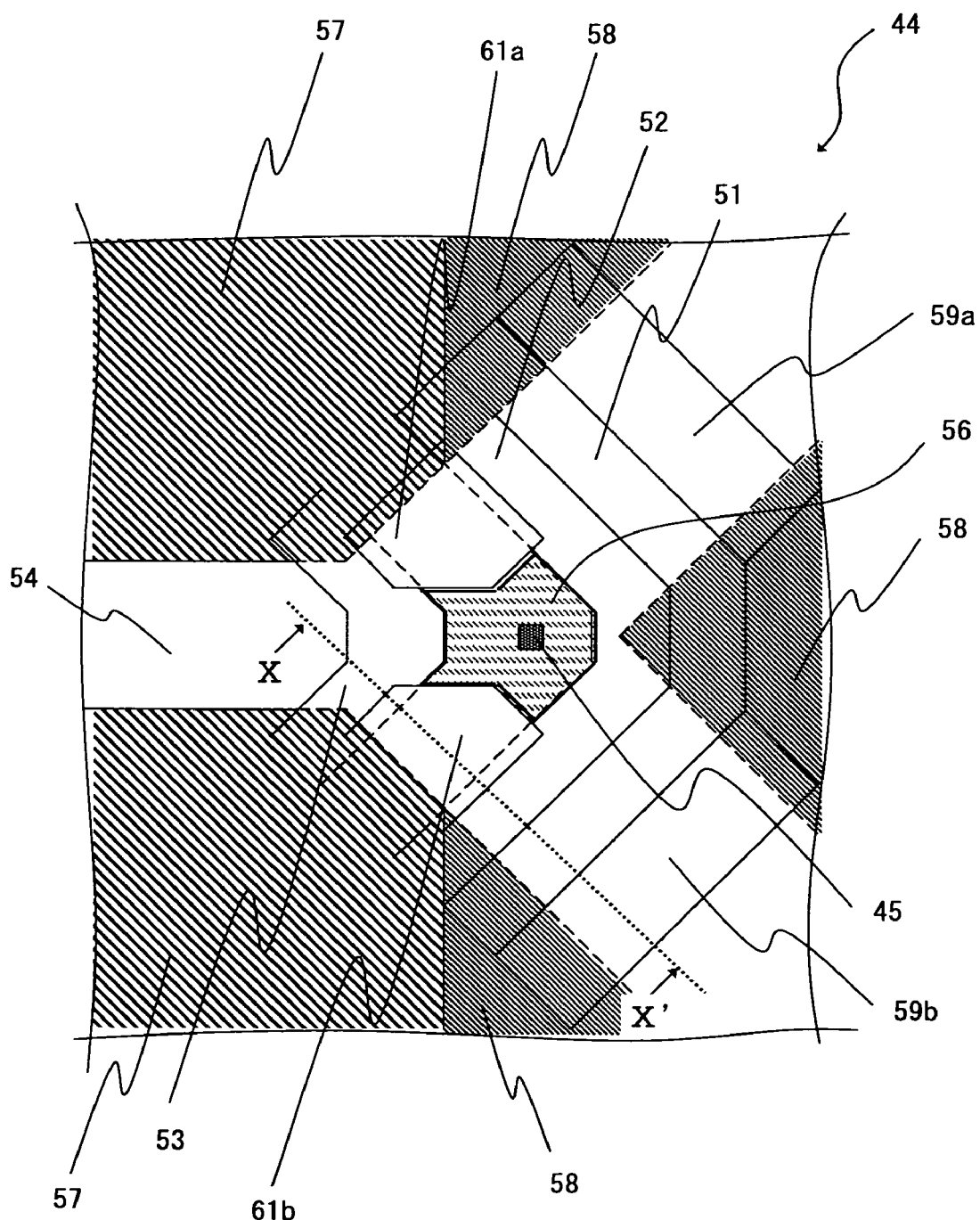
FIG. 9 is a view showing a charge detector according to a second embodiment of the invention.
Figure 10A:
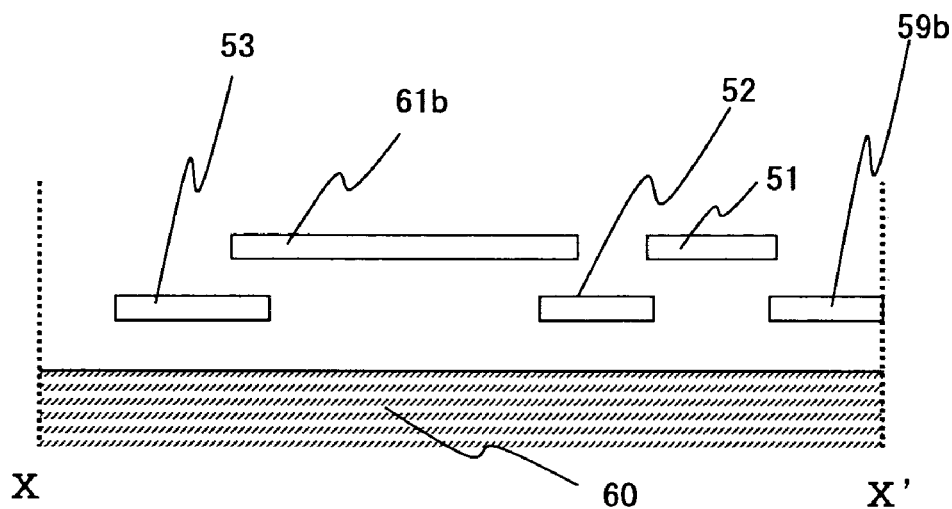
FIGS. 10A and 10B are sectional views along the line X-X' in FIG. 9.
Figure 10B:
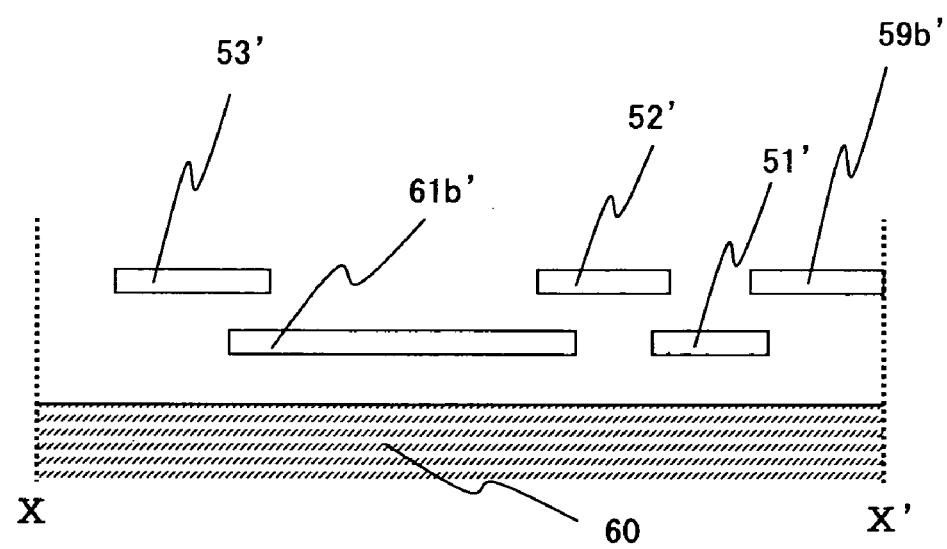

FIG. 8 is a view showing a charge detector of charge composition type according to a related art. FIG. 9 is a view showing a charge detector according to this embodiment, which is an enlarged view of the area S in FIG. 7. FIGS. 10A and 10B are sectional views along the line X-X' in FIG. 9. In FIGS. 8 and 9, the respective charge detectors include a contact 245, 45, a first output gate 251, 51, a second output gate 252, 52, a reset gate 253, 53, a drain 254, 54, a floating diffusion 256, 56, a locos oxide film 257, 57, a channel stopper 258, 58, and a register final gate 259a, 259b, 59a, 59b.

As shown in FIG. 8, in the charge detector 244 of two-phase driving type, the output gates 251 and 252 are narrowed for high-speed operation, and the reset gate 253 is placed so as to reduce the area of the floating diffusion 256. In such a configuration, the reset gate is bent elbow-shaped, and the area in contact with the floating diffusion 256 largely increases. This causes an increase in reset noise. Further, because the floating capacitance exists in the contact area of the reset gate 253 and the floating diffusion 256, the floating capacitance C cannot be reduced.

On the other hand, the charge detector 44 of this embodiment has such a configuration that the addition gates 61a and 61b are added to the configuration of FIG. 8 as in the first embodiment. This enables the reduction of the contact area with the reset gate 53 and the reduction of the area of the floating diffusion 56. The floating capacitance C can be thereby reduced.

FIG. 10A shows the cross section along the line X-X' in FIG. 9. FIG. 10B shows another example of the cross section, in which the corresponding elements are denoted by the corresponding reference numerals with an apostrophe ('). As in the first embodiment, the addition gate 61b may be disposed above the reset gate 53 and the second output gate 52 as shown in FIG. 10A. Alternatively, the addition gate 61b' may be disposed below the reset gate 53' and the second output gate 52' as shown in FIG. 10B. Specifically, the configuration should be such that the layer of the addition gates 61a, 61b (61a', 61b') and the layer of the second output gate 52 (52') are different in order that the addition gates 61a, 61b (61a', 61b') are not short-circuited with the reset gate 53 and (53') or the second output gate 52 (52').

This embodiment has the effects of the reduction of the floating capacitance, the reduction of reset noise, the suppression of a change in the floating capacitance due to misalignment, the smooth transfer of electric charges to the floating diffusion and so on, as in the first embodiment. In addition, as shown in FIG. 9, this embodiment enables the further reduction of the area of the floating diffusion 56 compared with the first embodiment and also enables the reduction of the side capacitance in the contact area with the reset gate 53, thereby further enhancing the effect of improving the detection sensitivity.

Third Embodiment

Figure 11:
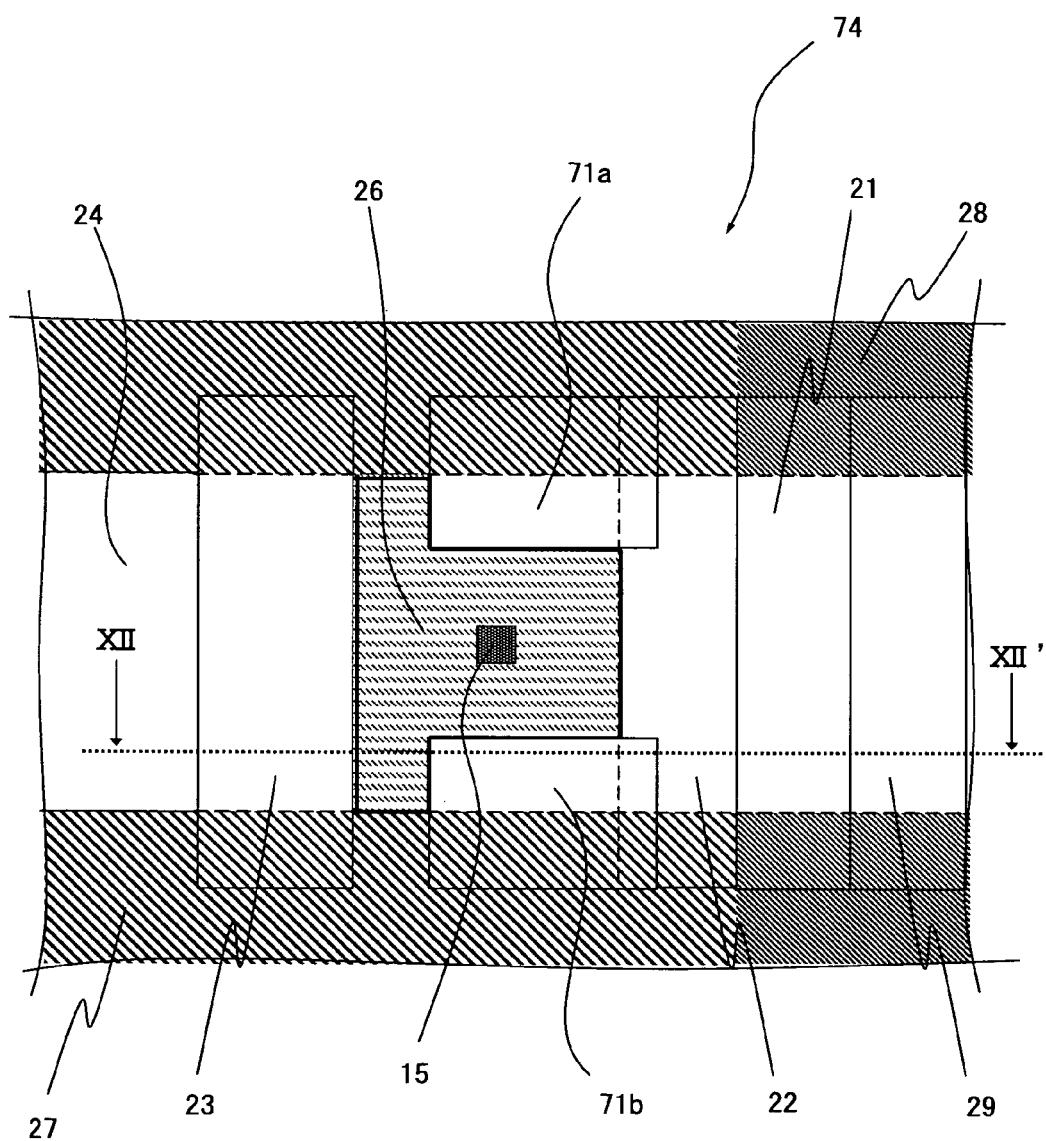
FIG. 11 is a view showing a charge detector according to a third embodiment of the present invention.

FIG. 11 is a view showing a charge detector according to a third embodiment of the present invention. In the following description, the same elements as in the first embodiment shown in FIG. 1 are denoted by the same reference numerals and not described in detail. As shown in FIG. 11, addition gates 71a and 71b are disposed in the position which is between the reset gate 23 and the second output gate 22 and in the upper end of the floating diffusion 26. In this embodiment, one ends of the addition gates 71a and 71b overlap with the end of the second output gate 22, and the other ends do not overlap with the reset gate 23. In this configuration, the channel becomes wider toward the reset drain 24 because of the presence of the addition gates 71a and 71b, and the electrons are more likely to flow toward the reset drain 24 upon reset ON. This shortens a minimum width of a reset pulse required.

Figure 12A:
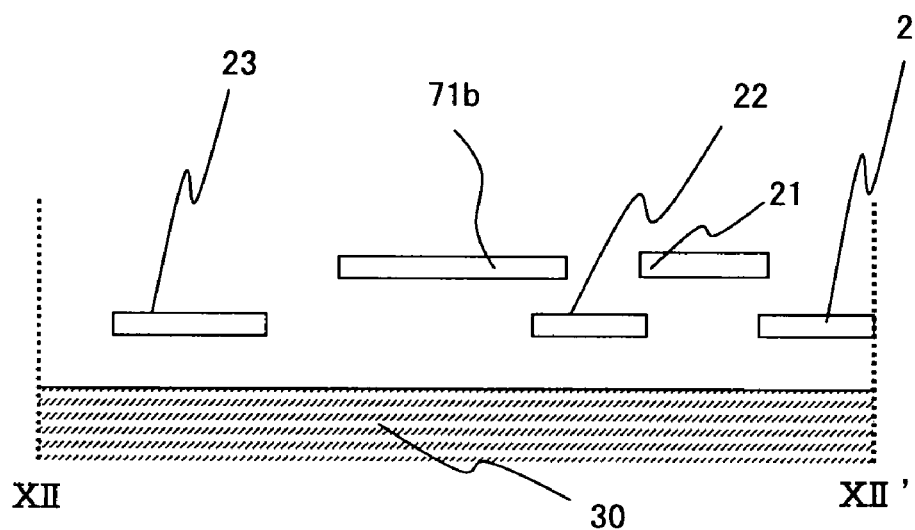
FIGS. 12A and 12B are sectional views along the line XII-XII' in FIG. 11.
Figure 12B:
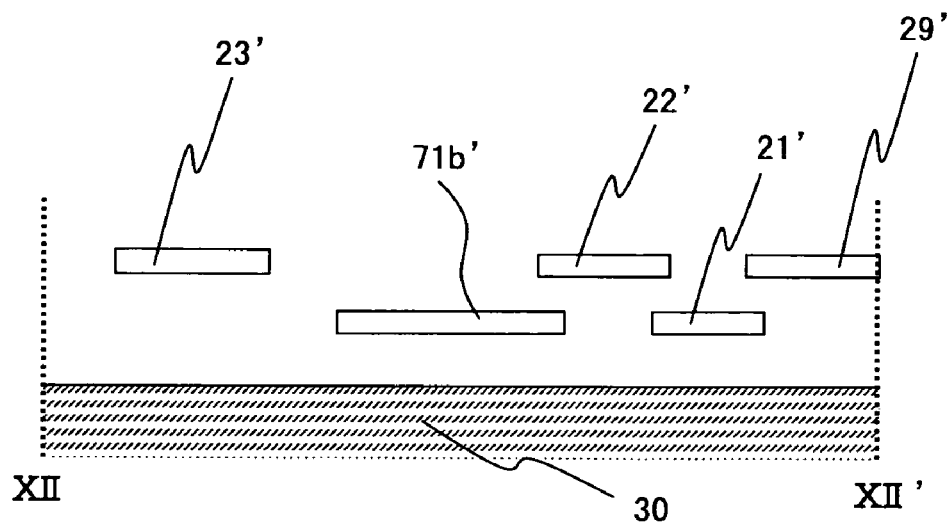

FIG. 12A shows the cross section along the line XII-XII' in FIG. 11. FIG. 12B shows another example of the cross section, in which the corresponding elements are denoted by the corresponding reference numerals with an apostrophe ('). As in the first embodiment, the addition gate 71b may be disposed above the reset gate 23 and the second output gate 22 as shown in FIG. 12A. Alternatively, the addition gate 71b' may be disposed below the reset gate 23' and the second output gate 22' as shown in FIG. 12B. Specifically, the configuration should be such that the layer of the addition gates 71a, 71b (71a', 71b') and the layer of the second output gate 22 (22') are different in order that the addition gates 71a, 71b (71a', 71b') are not short-circuited with the second output gate 22 (22'). This embodiment enables the reduction of the floating capacitance as in the first embodiment.

Further, this embodiment can shorten a minimum width of a reset pulse required in addition to having the effects such as the reduction of the floating capacitance and the suppression of a change in the floating capacitance in spite of misalignment. This reduces a required time for reset ON to thereby increase an electron drift speed upon reset ON.

Fourth Embodiment

Figure 13:
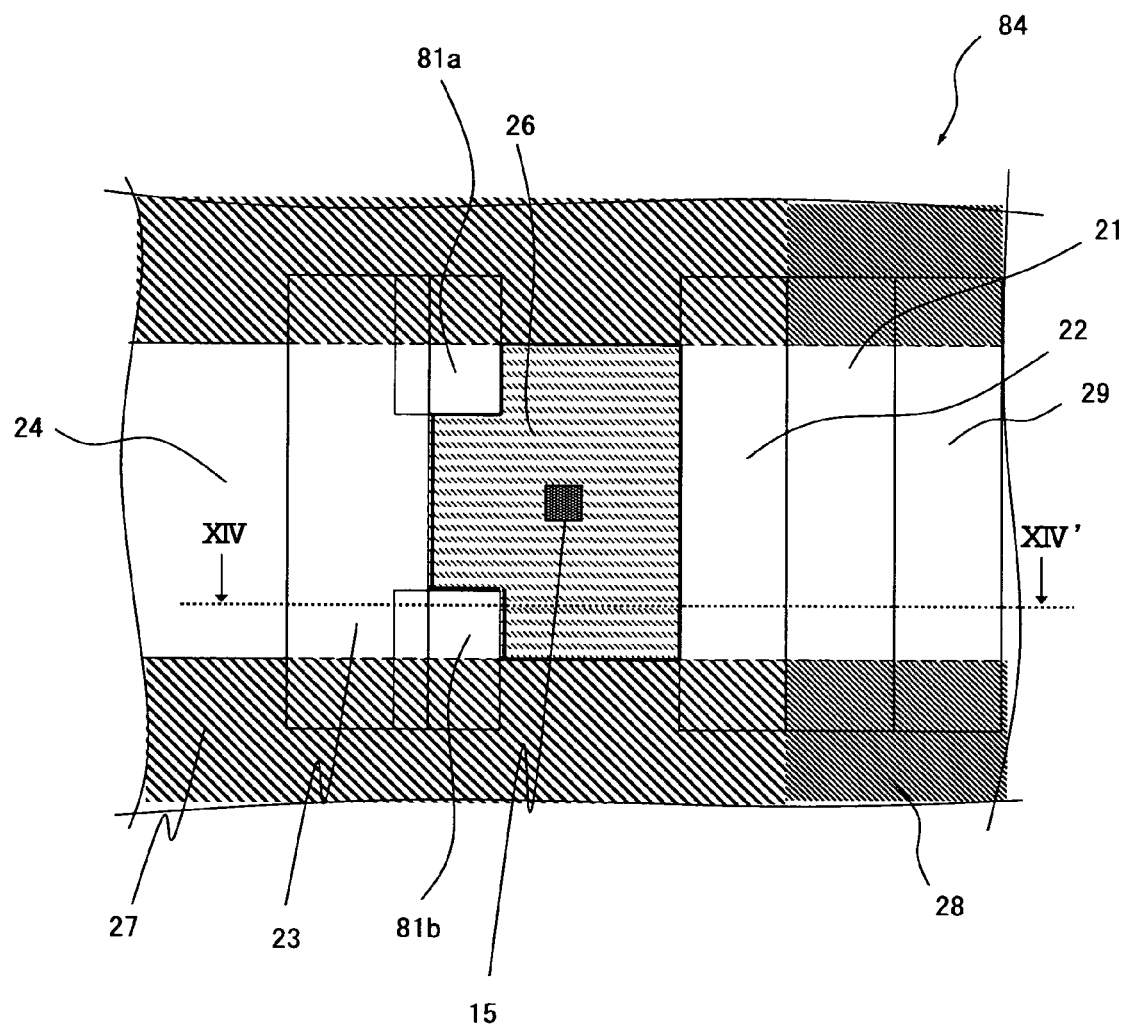
FIG. 13 is a view showing a charge detector according to a fourth embodiment of the present invention.

FIG. 13 is a view showing a charge detector according to a fourth embodiment of the present invention. In this embodiment, addition gates 81a and 81b are disposed in the position which is between the reset gate 23 and the second output gate 22 and in the upper end of the floating diffusion 26. In this embodiment, one ends of the addition gates 81a and 81b overlap with a part of the reset gate 23, and the other ends do not overlap with the second output gate 22. In this configuration, although the effect of reducing the floating capacitance is not as high as the first embodiment, the reset noise can be reduced equally to the first embodiment.

Figure 14A:
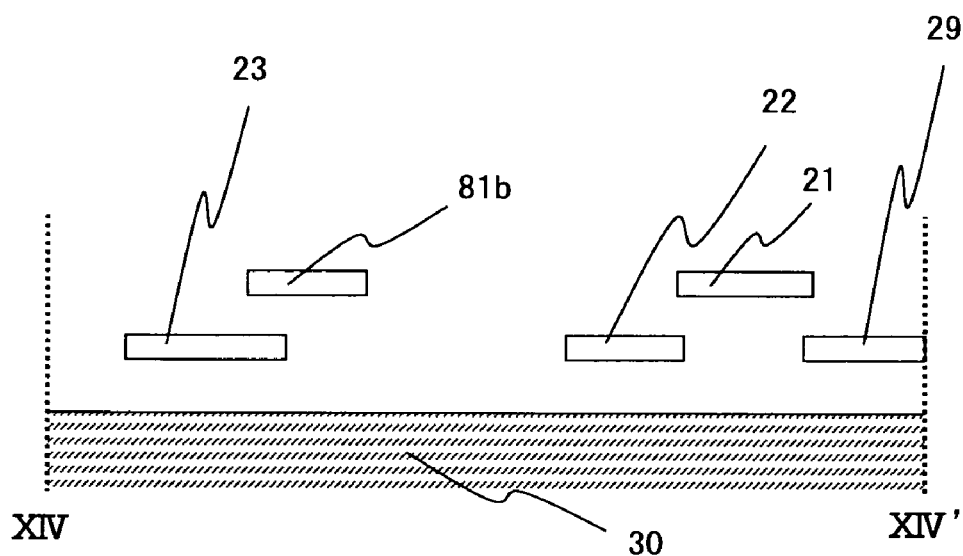
FIGS. 14A and 14B are sectional views along the line XIV-XIV' in FIG. 13.
Figure 14B:
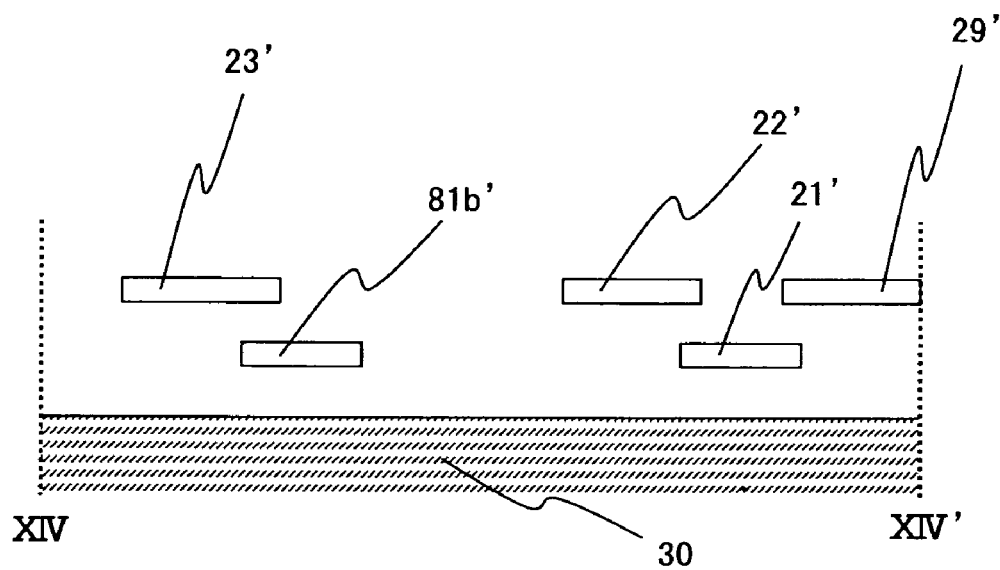

FIG. 14A shows the cross section along the line XIV-XIV' in FIG. 13. FIG. 14B shows another example of the cross section, in which the corresponding elements are denoted by the corresponding reference numerals with an apostrophe ('). As in the first embodiment, the addition gate 81b may be disposed above the reset gate 23 and the second output gate 22 as shown in FIG. 14A. Alternatively, the addition gate 81b' may be disposed below the reset gate 23' and the second output gate 22' as shown in FIG. 14B. Specifically, the configuration should be such that the layer of the addition gates 81a, 81b (81a', 81b') and the layer of the reset gate 23 (23') are different in order that the addition gates 81a, 81b (81a', 81b') are not short-circuited with the reset gate 23 (23'). This embodiment enables the reduction in the floating capacitance as in the first embodiment.

Figure 15:
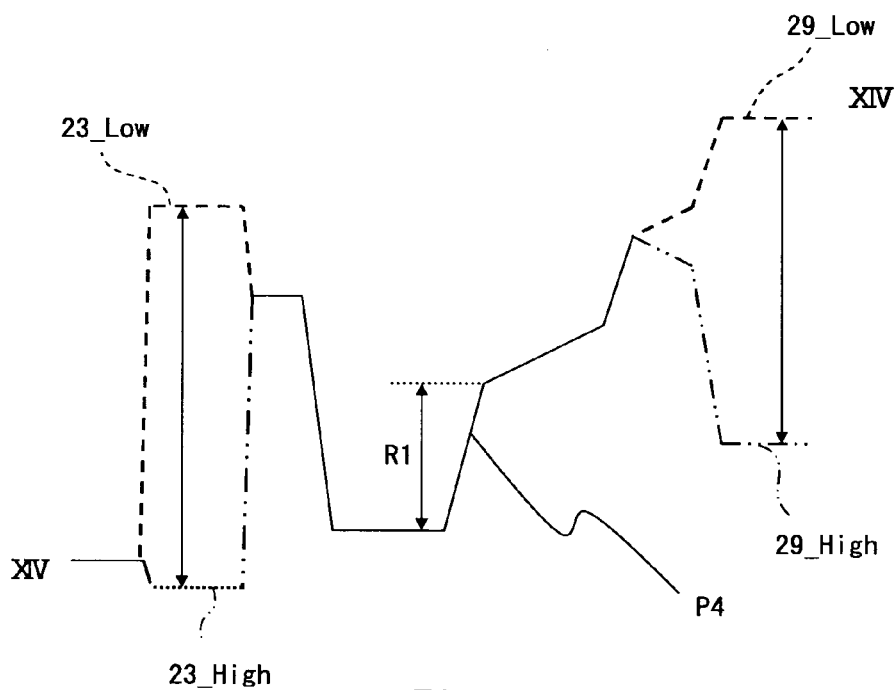
FIG. 15 is a view showing the potential gradient along the line XIV-XIV' in FIG. 13.

FIG. 15 is a view showing the potential gradient P4 along the cross section XIV-XIV' in FIG. 13. In FIG. 15, 29_High and 29_Low indicate the voltages which are applied to the final-stage register gate, and 23_Low and 23_High indicate the voltages which are applied to the reset gate. The deepest part of the potential which surrounds the floating diffusion 26 where the voltage is highest in the first embodiment is below the addition gates 31a and 31b, and the second-deepest part is below the second output gate 22.

In this embodiment, on the other hand, a constant current is applied to the addition gates 81a and 81b in order that the potential below the addition gates 81a and 81b is smaller than the potential below the second output gate 22. In such voltage setting, the deepest (greatest) part of the potential surrounding the floating diffusion 26 is below the second output gate 22. Consequently, a potential difference R1 between the potential of the floating diffusion 26 and the potential below the second output gate 22 is larger than the potential difference in the first embodiment. As a result, the dynamic range of the detection electric charge in this embodiment is wider than that in first to third embodiments.

Therefore, this embodiment has the effect of preventing a decrease in the dynamic range in addition to the effects of reducing the floating capacitance and reducing the reset noise because of the presence of the addition gates 81*a* and 81*b*.

Fifth Embodiment

Figure 16:
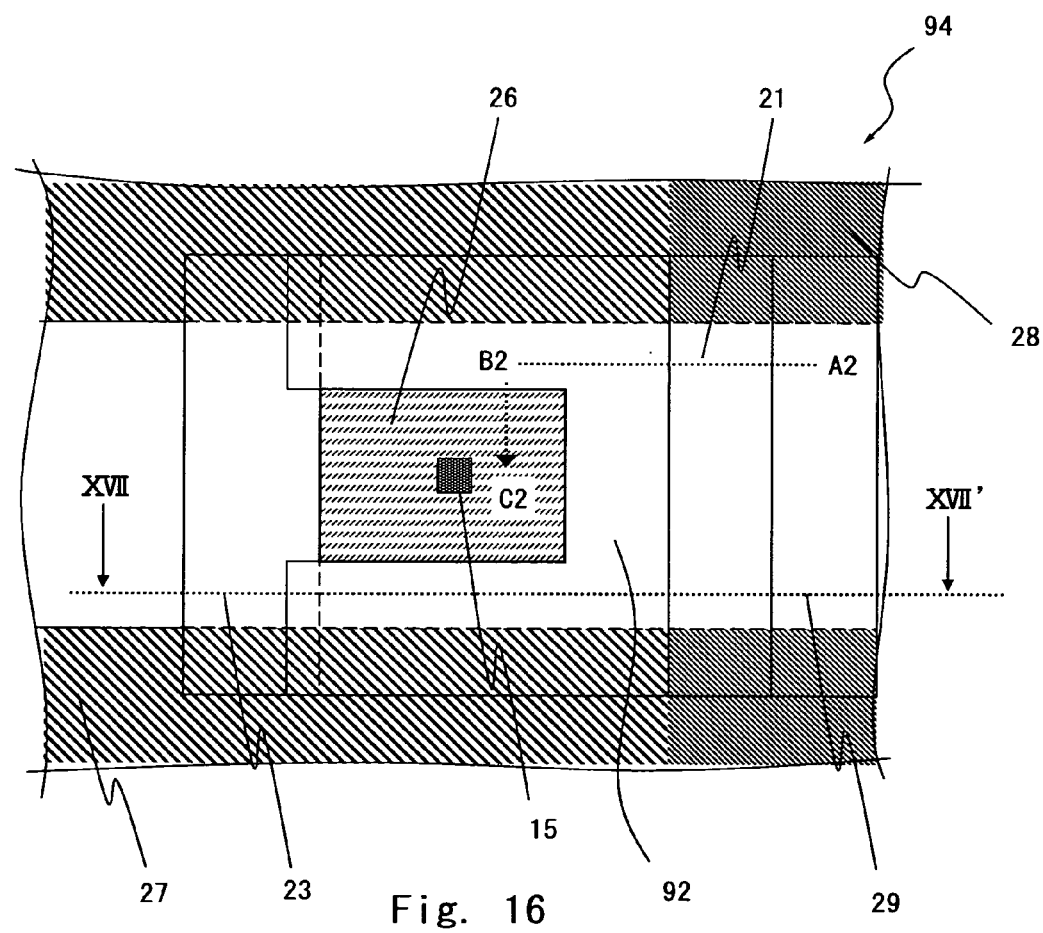
FIG. 16 is a view showing a charge detector according to a fifth embodiment of the present invention.

FIG. 16 is a view showing a charge detector according to a fifth embodiment of the present invention. In this embodiment, a second output gate 92 and the reset gate 23 are formed of electrodes in different layers. Further, the both ends of the second output gate 92 are extended to the reset gate 23 so that the second output gate 92 has a horseshoe-shape. The second output gate 92 of this embodiment is equivalent with a combination of the second output gate 22 and the addition gates 31*a* and 31*b* of the first embodiment which are formed integrally of the same electrode. This embodiment thus has the same effects regarding the floating capacitance and the reset noise as in the first embodiment.

Figure 17A:
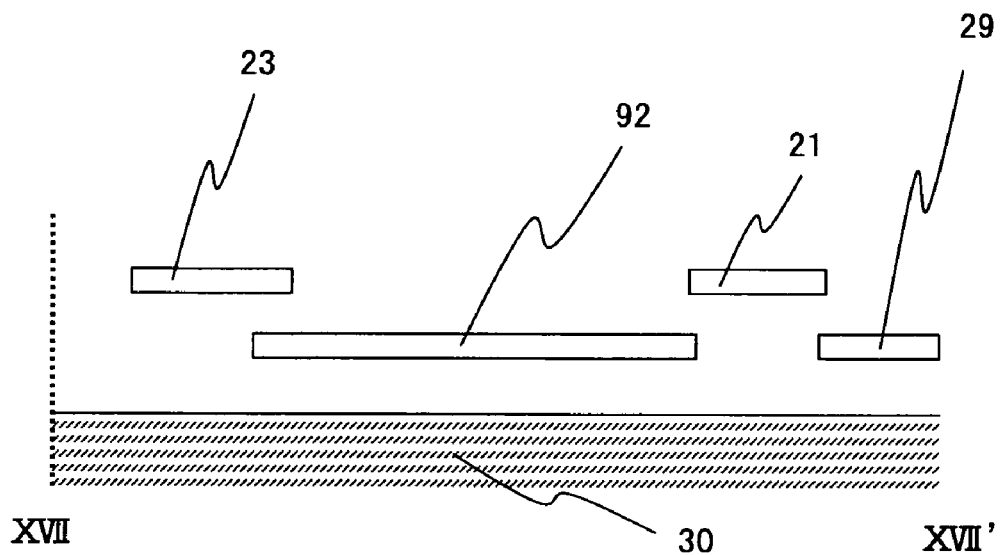
FIGS. 17A and 17B are sectional views along the line XVII-XVII' in FIG. 16.
Figure 17B:
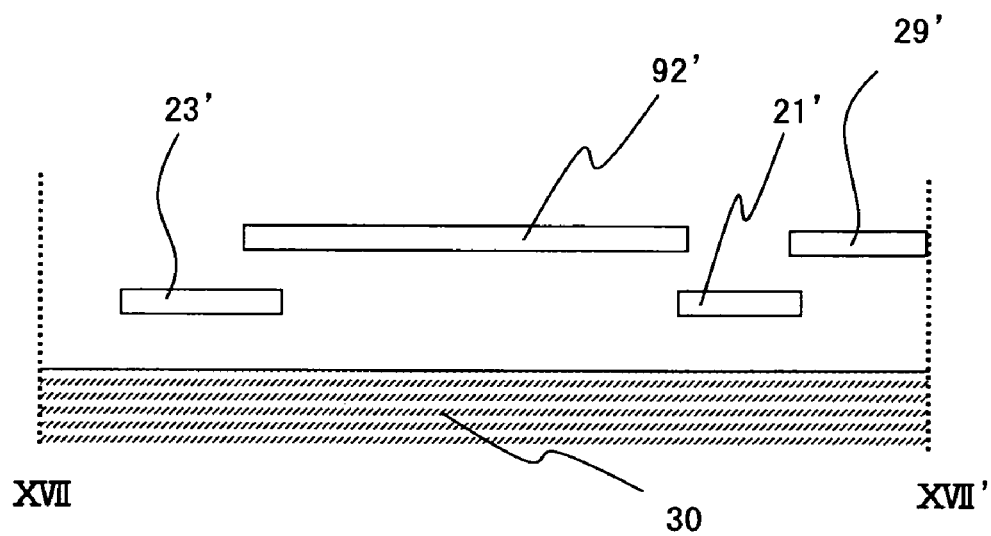

FIG. 17A shows the cross section along the line XVII-XVII' in FIG. 16. FIG. 17B shows another example of the cross section, in which the corresponding elements are denoted by the corresponding reference numerals with an apostrophe ('). The second output gate 92 may be disposed above the reset gate 23 as shown in FIG. 17A. Alternatively, the second output gate 92' may be disposed below the reset gate 23' as shown in FIG. 17B. Specifically, the configuration should be such that the layer of the second output gate 92 (92') and the layer of the reset gate 23 (23') are different in order that the second output gate 92 (92') is not short-circuited with the reset gate 23 (23'). This embodiment enables the reduction in the floating capacitance as in the first embodiment and further enables the reduction in reset noise.

Figure 18:
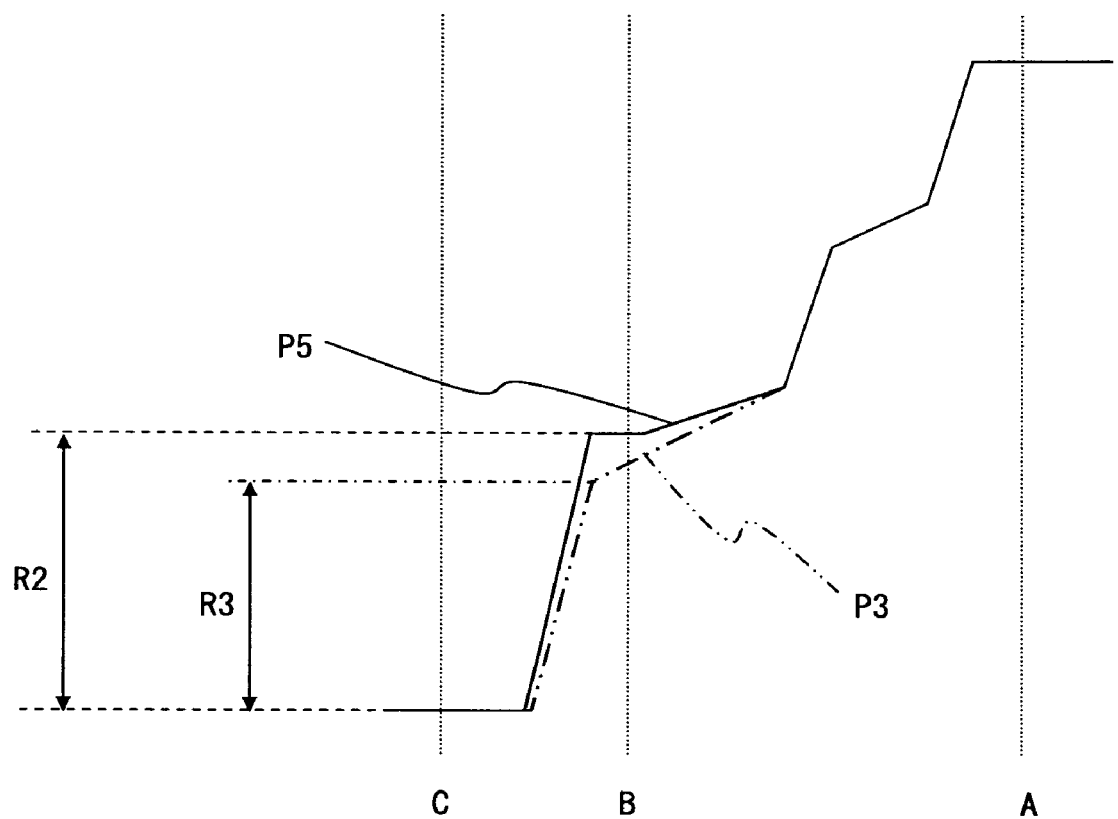
FIG. 18 is a view to describe the potential gradient along the points A2, B2 and C2 in FIG. 16.

FIG. 18 is a view showing the potential gradient P5 along the points A2, B2, C2 in FIG. 16. By way of comparison, FIG. 18 also shows the potential gradient P3 along the cross section A1 to C1 in the first embodiment. In the first embodiment, three gates, i.e. the first and second output gates and the addition gates, are employed and a voltage is applied to the floating capacitance so that the potential increases gradually. A difference between the potential of the floating diffusion 26 and the potential below the addition gates is R3 in the first embodiment.

This embodiment, on the other hand, employs two gates to thereby increase a difference R2 between the potential of the floating diffusion 26 and the potential below the second output gate 92 by the amount of the potential difference in one stage. This enlarges the dynamic range compared with the first to third embodiments.

In this embodiment, the both ends of the second output gate are extended to the reset gate so that the second output gate has a horseshoe-shape to cover the end of the floating diffusion. This configuration reduces the floating capacitance and also reduces the reset noise. In addition, because the second output gate is combined with the addition gate, this embodiment further prevents the reduction of the dynamic range compared with the first embodiment or the like.

As described in the foregoing, the first to fifth embodiments enable the reduction of floating capacitance to thereby improve the detection sensitivity. The first, second, fourth, and fifth embodiments enable the reduction of reset noise. The first to fourth embodiments enable the suppression of a change in floating capacitance in spite of misalignment. The first to third embodiments enable the smooth transfer of electric charges to the floating diffusion. The fourth and fifth embodiments prevent the reduction of dynamic range. The first to third embodiments enable the reduction of a required time of applying a reset pulse.

It is apparent that the present invention is not limited to the above embodiment that may be modified and changed without departing from the scope and spirit of the invention.

What is claimed is:

1. A solid-state imaging device comprising:
   a transfer element line transferring an electric charge photoelectrically converted in a photoelectric conversion element line formed of a plurality of photoelectric conversion elements; and
   a charge detector detecting an electric charge transferred by the transfer element line, the charge detector including:
      an output gate connected to a final stage of the transfer element line;
      a floating diffusion converting an electric charge transferred through the output gate into a voltage;
      a reset gate resetting the floating diffusion; and
      an addition gate formed above the floating diffusion and along an end from the output gate to the reset gate and supplied with a constant voltage.

2. The solid-state imaging device according to claim 1, wherein the addition gate is formed in a different layer from the output gate and the reset gate such that both ends of the addition gate respectively overlap with a part of the output gate and a part of the reset gate.

3. The solid-state imaging device according to claim 1, wherein the addition gate is formed in a different layer from the output gate such that one end of the addition gate overlaps with a part of the output gate.

4. The solid-state imaging device according to claim 1, wherein the addition gate is formed in a different layer from the reset gate such that one end of the addition gate overlaps with a part of the reset gate.

5. The solid-state imaging device according to claim 1, wherein the output gate is composed of a first output gate and a second output gate.

6. The solid-state imaging device according to claim 1, wherein the output gate and the reset gate are formed in the same layer.

7. The solid-state imaging device according to claim 2, wherein the output gate and the reset gate are formed in the same layer.

8. The solid-state imaging device according to claim 3, wherein the output gate and the reset gate are formed in the same layer.

9. The solid-state imaging device according to claim 4, wherein the output gate and the reset gate are formed in the same layer.

10. The solid-state imaging device according to claim 1, wherein the addition gate is integrally formed with the output gate.

11. The solid-state imaging device according to claim 4, wherein the addition gate is integrally formed with the output gate.

12. The solid-state imaging device according to claim 5, wherein the addition gate is integrally formed with the output gate.

13. The solid-state imaging device according to claim 6, wherein the addition gate is integrally formed with the output gate.

14. The solid-state imaging device according to claim 5, wherein the second output gate has a horseshoe-shape when viewed from top with an end being the addition gate and extending to the reset gate.

15. The solid-state imaging device according to claim 1, wherein the transfer element line is composed of a first transfer element line and a second transfer element line, and an electric charge is transferred alternately through the first and the second transfer element lines to the charge detector.

16. The solid-state imaging device according to claim 2, wherein the transfer element line is composed of a first transfer element line and a second transfer element line, and an electric charge is transferred alternately through the first and the second transfer element lines to the charge detector.

17. The solid-state imaging device according to claim 1, wherein a prescribed constant voltage is applied to the addition gate so that a potential below the addition gate is equal to or higher than a potential below the output gate in closest proximity to the addition gate and equal to or lower than a potential of the floating diffusion.

18. The solid-state imaging device according to claim 2, wherein a prescribed constant voltage is applied to the addition gate so that a potential below the addition gate is equal to or higher than a potential below the output gate in closest proximity to the addition gate and equal to or lower than a potential of the floating diffusion.

19. The solid-state imaging device according to claim 1, wherein a prescribed constant voltage is applied to the addition gate so that a potential below the addition gate is equal to or lower than a potential below the output gate in closest proximity to the addition gate.

20. The solid-state imaging device according to claim 3, wherein a prescribed constant voltage is applied to the addition gate so that a potential below the addition gate is equal to or lower than a potential below the output gate in closest proximity to the addition gate.

* * * * *